(12) United States Patent
Nakamura (10) Patent No.: US 7,577,054 B2
(45) Date of Patent: Aug. 18, 2009

(54) MEMORY WITH WORD-LINE DRIVER CIRCUIT HAVING LEAKAGE PREVENTION TRANSISTOR

(75) Inventor: Toshikazu Nakamura, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 104 days.

(21) Appl. No.: 11/979,237

(22) Filed: Oct. 31, 2007

(65) Prior Publication Data

US 2008/0137466 A1 Jun. 12, 2008

(30) Foreign Application Priority Data

Oct. 31, 2006 (JP) .............................. 2006-295320

(51) Int. Cl.
*G11C 8/00* (2006.01)
(52) U.S. Cl. ............................ 365/230.06; 365/185.23; 365/227; 365/228
(58) Field of Classification Search ............ 365/230.06, 365/185.232, 227, 228
See application file for complete search history.

(56) References Cited

U.S. PATENT DOCUMENTS 6,809,986 B2 * 10/2004 Kim et al. .............. 365/230.06

| | | | | |
|---|---|---|---|---|
| 2003/0039143 A1 * | 2/2003 | Ogane | .................... | 365/185.23 |
| 2006/0198231 A1 * | 9/2006 | Larguier et al. | ........ | 365/230.06 |
| 2006/0239108 A1 * | 10/2006 | Shimizu et al. | ........ | 365/230.06 |
| 2008/0123463 A1 * | 5/2008 | Matsubara | ............. | 365/230.06 |

FOREIGN PATENT DOCUMENTS

| JP | 10-312682 | 11/1998 |
|---|---|---|
| JP | 11-86543 | 3/1999 |

* cited by examiner

*Primary Examiner*—Anh Phung
*Assistant Examiner*—Eric Wendler
(74) *Attorney, Agent, or Firm*—Arent Fox LLP.

(57) ABSTRACT

In a semiconductor memory having a plurality of word lines and bit lines and memory cells arranged at the positions of intersection thereof, a word driver circuit that drives the word line has a drive PMOS transistor and drive NMOS transistor which are connected in series between a first node and a second node and each of which has a gate connected to a third node, the word line being connected to a connection node of the two transistors. A first voltage or a second voltage lower than the first voltage is then applied to the third node, and the first voltage or second voltage is applied to the first node. In addition, between the third node and the gate of the drive PMOS transistor, there is provided a leakage prevention NMOS transistor having a gate applied with the first voltage or a voltage in the vicinity thereof.

14 Claims, 9 Drawing Sheets

Stanby Mode

FIG.1

SWDR

FIG.4    Stanby Mode

MWDR

SWDR0

SWDR1

FIG.5

FIG.6  Active Mode (1)

FIG.7  Active Mode (2)

MEMORY WITH WORD-LINE DRIVER CIRCUIT HAVING LEAKAGE PREVENTION TRANSISTOR

CROSS-REFERENCE TO RELATED APPLICATIONS

This application is based upon and claims the benefit of priority from the prior Japanese Patent Application No. 2006-295320, filed on Oct. 31, 2006, the entire contents of which are incorporated herein by reference.

BACKGROUND

The present embodiment relates to a semiconductor device and in particular relates to a semiconductor memory having a word driver circuit in which leakage current is suppressed.

In recent years there is a tendency for dynamic RAM (DRAM) to be used as large-capacity memory of battery-driven electronic equipment such as cellular phone. In particular, the demand for pseudo-SRAM has increased since pseudo-SRAM is a type of DRAM a refresh command can be generated internally and does not need to be supplied from outside, but the memory cells are DRAM.

In DRAM having such applications, reduction of the current consumption during standby is required in order to prolong the standby time of the cellular phone that can be achieved with the battery. Current consumption during standby includes the AC current for refresh operation, the DC current needed for operation of the power source circuit, and the sub-threshold current and the gate induced drain leakage current (GIDL) of the transistors.

In particular, the internal power source of recent DRAMs includes a boosted voltage (Vpp) that is boosted from the external power source (Vdd), and a negative power source Vnwl (nwl: negative word line) that is lower than ground (Vss). The boosted voltage Vpp is used as word line selection potential: the restore potential of the cell can be raised by applying high boosted voltage Vpp to the gate of the cell transistor. In contrast, the negative power source Vnwl is utilized as the word line non-selection potential and makes it possible to reduce the sub-threshold leakage current of the cell transistor.

On the other hand, the drive capacity of the word line is reduced by using a segmented word line structure as the word line structure of the DRAM. With a segmented word line structure, a main word line is provided with a plurality of sub-word lines, the main word line being selected by a main word decoder, and, in addition, sub-word lines being selected by a sub-word decoder. Also, a sub-word driver circuit is used to drive a single sub-word line based on logic of a selected main word line and a selected sub-word decoding signal.

An example of a segmented word line layout having such main word lines and sub-word lines is disclosed for example in Laid-open Japanese Patent Application No. H10-312682 and in Laid-open Japanese Patent Application No. H11-86543. Laid-open Japanese Patent Application No. H10-312682 states that the area of a sub-word driver can be reduced by constituting the sub-word driver using one PMOS and two NMOS transistors. Also, Laid-open Japanese Patent Application No. H11-86543 describes a sub-word driver circuit arranged to be capable of driving a sub-word line with boosted potential and negative potential.

In a segmented word line construction, the sub-word driver circuits comprise CMOS circuits comprising three transistors. Specifically, the selected main word line is driven to L level, and the selected sub-word decoding signal is driven to H level, and therefore the sub-word line is driven to H level (selection level) by a PMOS transistor of the sub-word driver circuit. Also, the non-selected main word lines are driven to H level, and the sub-word lines are driven to L level (non-selected level) by an NMOS transistor of the sub-word driver circuit. The sub-word line can be driven to L level (non-selected level) by the second NMOS transistor by making the sub-word decoding signal L level and making the inverted sub-word decoding signal H level, even if the main word line is L level (selection level).

As described above, by using boosted potential Vpp for the word line H level and using negative potential Vnwl for the word line L level, excess voltage is applied to the PMOS and NMOS transistors of the word driver circuit, causing the GIDL current on standby to increase. In particular, when the transistors are made of extremely small size in order to achieve high RAM capacity, the increase in GIDL current reaches a level that cannot be neglected.

The GIDL current depends on the gate voltage of the transistor and is the current that flows between the substrate and source or drain in the vicinity directly below the gate electrode. For example, in the case of a PMOS transistor, when negative potential Vnwl is applied to the source or drain and boosted potential Vpp is applied to the substrate and gate, the GIDL current is increased. Likewise in the case of an NMOS transistor, the GIDL current is increased when boosted potential Vpp is applied to the source or drain and negative potential Vnwl is applied to the substrate and gate.

When the GIDL current increases, it is necessary to further actuate the pumping action of the pumping circuits that generate the power sources Vpp and Vnwl of the word driver and this tends to result in increased current consumption during standby. In other words, increase in the GIDL current makes it necessary for the pumping circuits to pump more charge. Regarding the efficiency of these pumping circuits, the current supplied to the boosted potential Vpp is only of the order about 25% of the current of the external power source Vdd, and the current supplied to the negative potential Vnwl is only about 80% of the current of the external power source Vdd, so, combining these two, the efficiency of these pumping circuits is only about 20%. Consequently, the effective efficiency of pumping current generation by the pumping circuits is further lowered by the current between Vpp and Vnwl produced by the GIDL current, thereby tending to increase the current of the external power source Vdd to an extent that cannot be neglected.

SUMMARY

An object of the present embodiment is therefore to provide a semiconductor memory having a word driver circuit wherein GIDL current is suppressed.

A further object of the present embodiment is to provide a semiconductor memory wherein current consumption during standby is suppressed.

In order to achieve the above object, according to a first aspect of the present embodiment, in a semiconductor memory having a plurality of word lines and bit lines and memory cells arranged at the positions of intersection thereof, a word driver circuit that drives the word line has a drive PMOS transistor and drive NMOS transistor which are connected in series between a first node and a second node and each of which has a gate connected to a third node, the word line being connected to a connection node of the two transistors. A first voltage or a second voltage lower than the first voltage is then applied to the third node, and the first voltage or second voltage is applied to the first node. In addition, between the third node and the gate of the drive PMOS transistor, there is provided a leakage prevention NMOS transistor having a gate applied with the first voltage or a voltage in the vicinity thereof.

By the provision of this leakage prevention NMOS transistor, a voltage lower than the first voltage by the amount of the threshold voltage of the leakage prevention NMOS transistor is applied to the gate of the drive PMOS transistor even if the second voltage is applied to the first node and the first voltage is applied to the third node, so the voltage between the gate and source and the voltage between the gate and drain of the drive PMOS transistor are suppressed, with the result that the GIDL current is suppressed.

The first voltage may be for example a boosted power source voltage obtained by boosting an external power source, and the second voltage may be for example negative power source voltage obtained by depressing the voltage of the ground power source. Even though this boosted power source voltage and negative power source voltage are applied to the word driver circuit, the leakage current, in particular the GIDL current, of the drive PMOS transistor can be suppressed by providing a leakage prevention NMOS transistor.

In order to achieve the above object, according to a second aspect of the present embodiment, in a semiconductor memory having a plurality of word lines and bit lines and memory cells arranged at the positions of intersection thereof, a word driver circuit that drives the word line has a drive PMOS transistor and drive NMOS transistor which are connected in series between a first node and a second node and each of which has a gate connected to a third node, the word line being connected to a connection node of the two transistors. A first voltage or a second voltage lower than the first voltage is then applied to the third node, and the first voltage is applied to the first node. In addition, between the third node and the gate of the drive NMOS transistor, there is provided a leakage prevention PMOS transistor having a gate applied with the second voltage or a voltage in the vicinity thereof.

By the provision of this leakage prevention PMOS transistor, even though the first voltage is applied to the first node and the second voltage is applied to the third node, so that, the word line is driven with the first voltage, voltage higher than the second voltage by the amount of the threshold voltage of the leakage prevention PMOS transistor is applied to the gate of the drive NMOS transistor; the voltage between the gate and drain of the drive NMOS transistor is consequently suppressed, with the result that the GIDL current is suppressed.

The first voltage may be for example a boosted power source voltage obtained by boosting an external power source, and the second voltage may be for example negative power source voltage obtained by depressing the voltage of the ground power source. By the provision of the leakage prevention PMOS transistor, even though this boosted power source voltage and negative power source voltage are applied to the word driver circuit, the leakage current of the drive NMOS transistor, in particular the GIDL current, can be suppressed.

In order to achieve the above object, according to a third aspect of the present embodiment, a semiconductor memory having a plurality of word lines and bit lines and memory cells arranged at the positions of intersection thereof further has:

a word driver circuit that drives the word line and has a drive PMOS transistor and drive NMOS transistor which are connected in series between a first node and a second node and each of which has a gate connected to a third node, the word line being connected to a connection node of the two transistors;

a first voltage generating circuit that generates a first voltage; and a second voltage generating circuit that generates a second voltage lower than the first voltage, wherein the first voltage or the second voltage is applied to the third node, the first voltage or the second voltage is applied to the first node, and, in addition, between the third node and the gate of the drive PMOS transistor, there is provided a leakage prevention NMOS transistor having a gate applied with a prescribed voltage.

In order to achieve the above object, according to a fourth aspect of the present embodiment, a semiconductor memory having a plurality of word lines and bit lines and memory cells arranged at the positions of intersection thereof further has:

a word driver circuit that drives the word line and has a drive PMOS transistor and drive NMOS transistor which are connected in series between a first node and a second node and each of which has a gate connected to a third node, the word line being connected to a connection node of the two transistors;

a first voltage generating circuit that generates a first voltage; and a second voltage generating circuit that generates a second voltage lower than the first voltage, wherein the first voltage or the second voltage is applied to the third node, the first voltage is applied to the first node, and, in addition, between the third node and the gate of the drive NMOS transistor, there is provided a leakage prevention PMOS transistor having a gate applied with a prescribed voltage.

With the present embodiment, the GIDL current of the word driver circuit can be suppressed, making it possible to provide a semiconductor memory in which the current consumption during standby is reduced.

DESCRIPTION OF THE EMBODIMENTS

Embodiments are described below with reference to the drawings. However, the technical scope of the present embodiment is not restricted to these embodiments and extends to the items set out in the scope of the patent claims and equivalents thereof.

Figure 1:
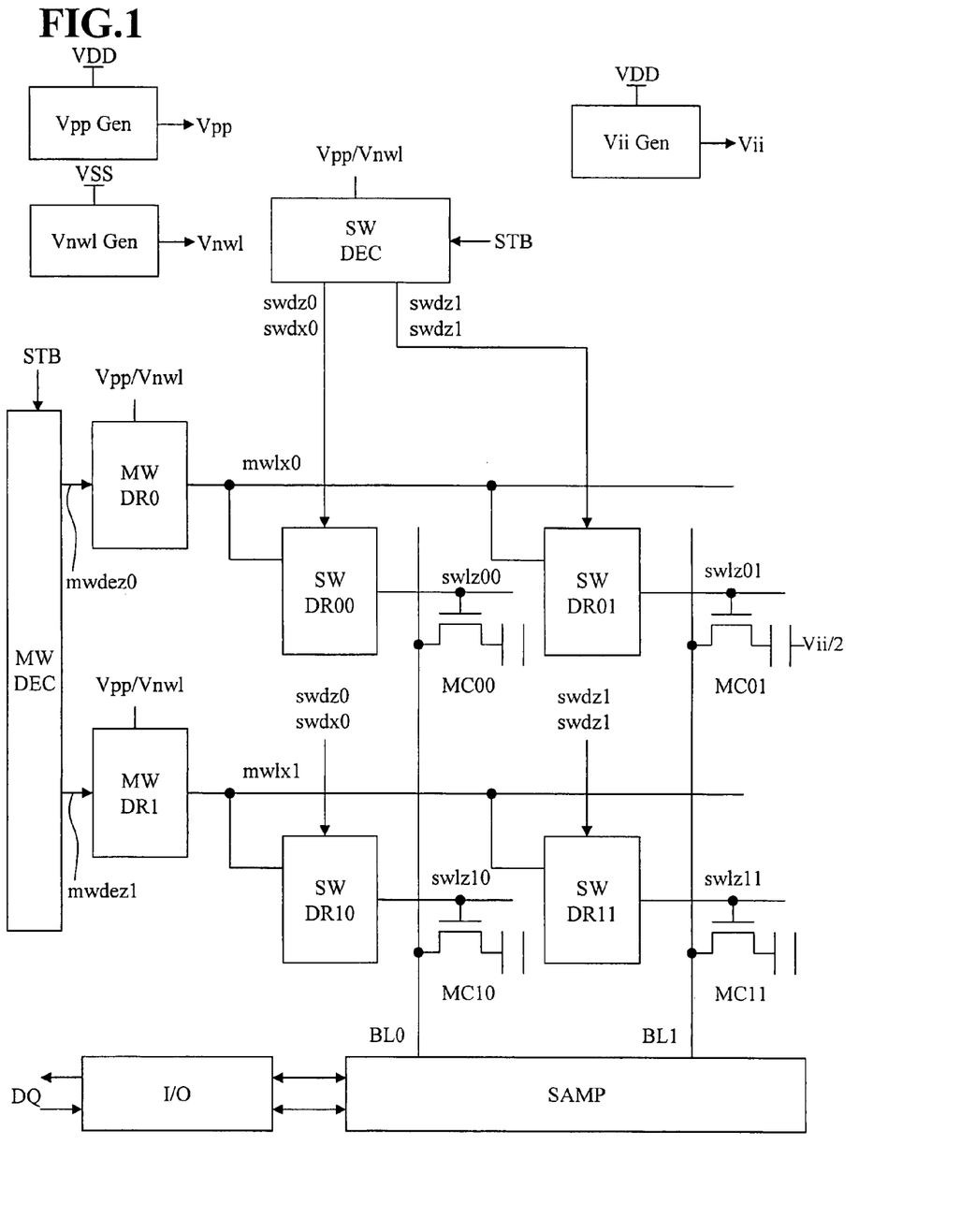
FIG. 1 is a layout diagram of a semiconductor memory according to an embodiment of the present embodiment.

FIG. 1 is a layout diagram of a semiconductor memory according to an embodiment. First of all, internal power sources Vpp, Vii, and Vnwl are generated from the external power source VDD that is supplied from outside and the ground power source VSS. The boosted power source generating circuit VppGen generates the boosted internal power source Vpp (first voltage) by boosting the external power source VDD. The depressed power source generating circuit VnwlGen generates the negative power source Vnwl (second voltage) by depressing the ground power source VSS. In addition, the internal power source generating circuit ViiGen generates the internal power source Vii of the cell array from the external power source VDD. The voltage of the bit line is stored in the memory cells after being amplified to the level of the cell power source Vii.

The semiconductor memory FIG. 1 comprises a segmented word structure wherein the word line is constituted by a main word line mwlx and a plurality of sub-word lines swlz associated therewith. It should be noted that, in the present specification, the suffix x is added to the symbol of a signal whose active level is L level and the suffix z is added to the symbol of a signal whose active level is H level, respectively. Consequently, the selection level of the main word line mwlx is L level and the selection level of the sub-word line swlz is H level.

In the example of FIG. 1, two sub-word lines swlz00 and swlz01 are provided for the main word line mwlx0, and two sub-word lines swlz10 and sxlz11 are provided for the main word line mwlx1. The main word lines mwlx0,1 are respectively driven by the main word drivers MWDR0,1 and the sub-word lines swlz00,01 are respectively driven by the sub-word drivers SWDR00,01, while the sub-word lines swlz10, 11 are respectively driven by the sub-word drivers SWDR10, 11.

The main word drivers MWDR0,1 drive the main word line mwlx to L level as the selection level or H level as the non-selection level in accordance with the main word decoding signal mwdez0,1 from the main word decoder MWDEC. The sub-word drivers SWDR00 to 11 drive the sub-word line swlz to H level as the selection level or L level as the non-selection level in accordance with the sub-word decoding signal swdz/swdx from the sub-word decoder SWDEC and the main word line mwlx. The sub-word decoder SWDEC generates a sub-word decoding signal swdz/swdx that selects a single sub-word line from a plurality of sub-word lines belonging to the main word line. These sub-word decoding signals swdz/swdx are complementary signals.

In the example of FIG. 1, a group of two sub-word lines swlz00, 01 divided in the word line direction was provided in respect of a main word line mwlx0, but it would also be possible to provide a set of a plurality of sub-word lines swlz in respect of a single main word line mwlx0. For example, in the case where there are provided a set of four sub-word lines swlz, four sub-word drivers SWDR00 are provided, and four sub-word decoding signals swdz/swdx from the sub-word decoder SWDEC are respectively supplied to the four sub-word drivers SWDR00. In this case, the layout of the memory cell array is a layout such that the pitch of a single main word line mwlx is equal to the pitch of the four sub-word lines swlz.

Memory cells MC00 to MC11 are provided at the intersection positions of the sub-word lines swlz00 to 11 and bit lines BL0, BL1. The memory cells are constituted by a cell transistor driven by the sub-word line swlz and a capacitor connected to the cell transistor: the electrode of the capacitor on the opposite side to the cell transistor is connected to Vii/2.

The bit lines BL0, BL1 are amplified by the cell amplifier SAMP and data of the selected bit line is output from the input/output circuit I/O.

In the main word driver MWDR, boosted power source Vpp is supplied as the H level voltage and negative power source Vnwl is supplied as the L level voltage. However, during standby, for example boosted voltage, as described later, is supplied rather than L level voltage. Thus the main word driver drives the selected main word line mwlx to L level voltage and drives the non-selected main word line mwlx to H level voltage.

Furthermore, in the case of the sub-word decoder SWDEC, boosted power source Vpp is supplied as H level voltage and negative power source Vnwl is supplied as L level voltage: thus the selected level of the sub-word decoding signal swdz is the level of the boosted power source Vpp and the non-selected level is the level of the negative power source Vnwl. Thus the sub-word driver SWDR drives the sub-word line swlz in accordance with the corresponding main word line mwlx and sub-word decoding signal swdz/swdx. The selection level of the sub-word line swlz is the boosted voltage Vpp and the non-selection level is the negative voltage Vnwl.

In the segmented word line construction of FIG. 1, in order to select the sub-word line swlz00, the main word driver MWDR0 drives the main word line mwlx0 to L level and the sub-word decoder SWDEC drives the sub-word decoding signal swdz0 to H level and drives the swdx0 signal to L level. Then, in response to this, the sub-word driver SWDR00 drives the sub-word line swlz00 to H level (Vpp). On the other hand, the main word driver MWDR1 drives the main word line mwlx1 to H level and, in response to this, the sub-word drivers SWDR10, 11 cause the corresponding sub-word lines swlz10, 11 to become L level (Vnwl). In addition, the sub-word decoder SWDEC drives the sub-word decoding signal swdz1 to L level and drives the swdx1 signal to H level; as a result, the sub-word driver SWDR01 that is connected to the selected main word line mwlx0 causes the sub-word line swlz01 to become L level (Vnwl).

In the standby condition, in response to the standby signal STB, the main word decoder MWDEC causes all of the main words decoding signal mwdez to be L level, and, in response to this, all of the main word drivers MWDR cause their main word lines mwlx to become H level (Vpp level). Likewise, in response to the standby signal STB, the sub-word decoder SWDEC causes all of the sub-word decoding signals swdz to become L level (Vnwl) and all the sub-word drivers SWDR cause their sub-word lines swlz to become L level (Vnwl). Also, in the standby condition, the bit lines BL are pre-charged to Vii/2.

Figure 2A:
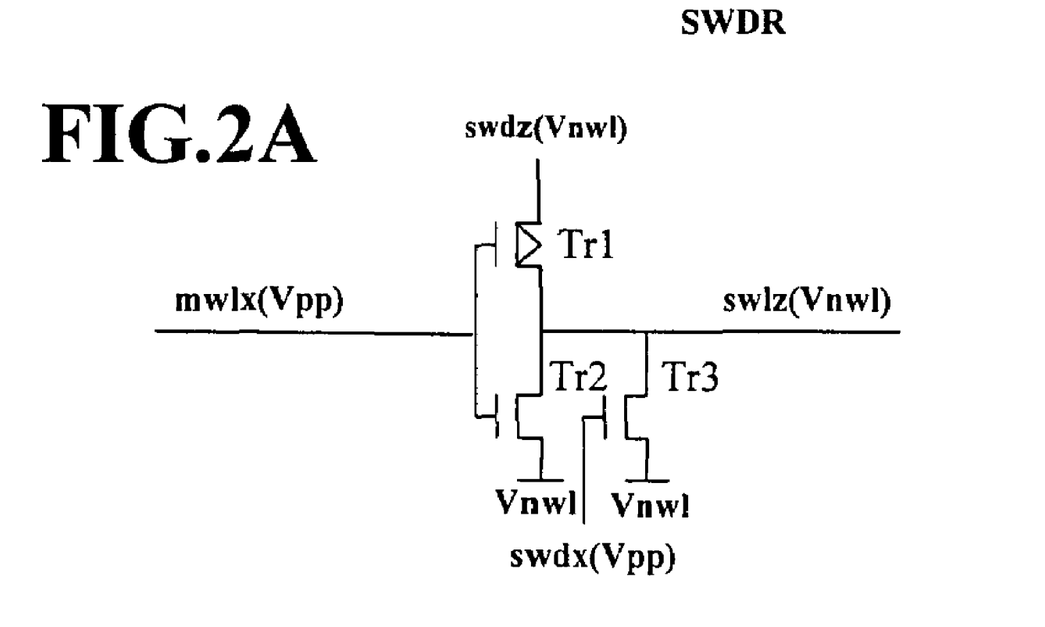
FIG. 2 is a view given in explanation of the sub-word driver circuit and the GIDL current thereof.

FIG. 2 shows views given in explanation of the sub-word driver circuits and their GIDL currents. The sub-word driver SWDR of FIG. 2A has a drive PMOS transistor Tr1 and NMOS transistor Tr2 connected in series and the main word line mwlx thereof is connected to the third node to which the gates of both of these transistors Tr1, Tr2 are connected. Also, the sub-word decoding signal swdz is connected to the source node (first node) of the PMOS transistor Tr1, while the negative voltage Vnwl is connected to the source node (second node) of the NMOS transistor Tr2. Also, the sub-word line swlz is connected to the connection node of the transistors Tr1, Tr2. In addition, a drive NMOS transistor Tr3 is provided in parallel with the NMOS transistor Tr2, and the inverted side sub-word decoding signal swdx is supplied to the gate thereof.

The voltages Vpp and Vnwl indicated at each node of FIG. 2 indicate a certain voltage condition of the standby condition. Specifically, in this voltage condition, the main word line mwlx is at the boosted voltage Vpp of the non-selected condition and the sub-word decoding signal swdz is at the negative voltage Vnwl of the selected condition. The NMOS transistor Tr2 is thereby put in conductive condition and the sub-word line swlz is given the negative voltage Vnwl of the non-selected condition.

Figure 2B:
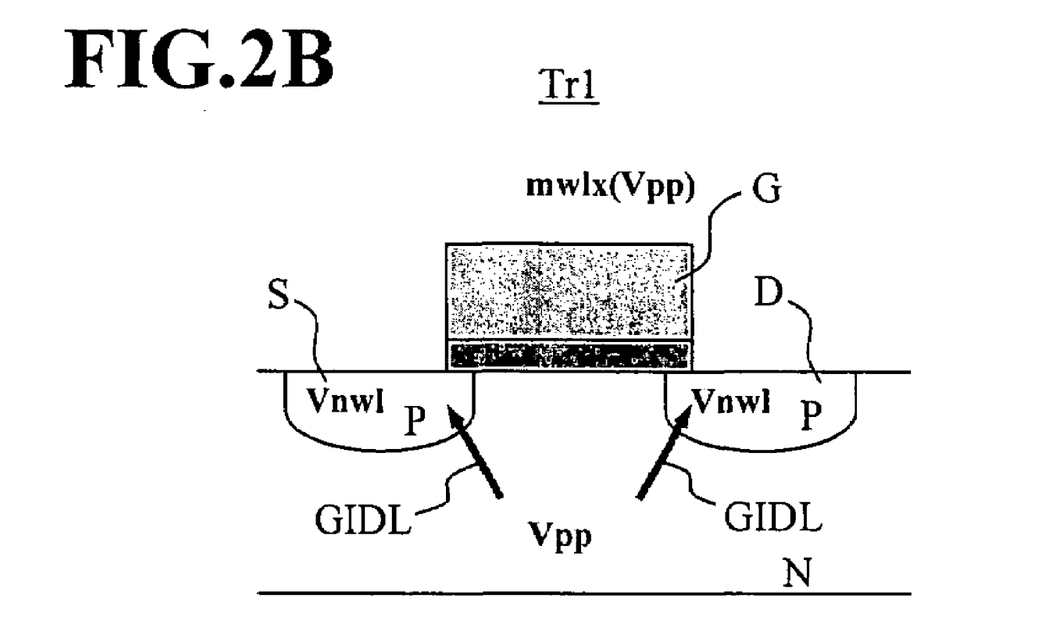

FIG. 2B shows a cross-sectional view of the drive PMOS transistor Tr1; in the standby condition of FIG. 2A, the N-type substrate is connected to the boosted voltage Vpp and boosted voltage Vpp is applied also to the gate G, while negative voltage Vnwl is applied to the P-type source/drain regions S, D.

In this case, with the elevation of the gate voltage, leakage current in the direction of the source or drain from the substrate is generated in the vicinity of the interface of the N-type substrate and the gate oxide film. This is the GIDL current. In particular, due to adoption of the negative voltage Vnwl for the non-selected level of the word lines and miniaturization of the sub-word driver transistors, such GIDL current becomes non-negligible.

Figure 3A:
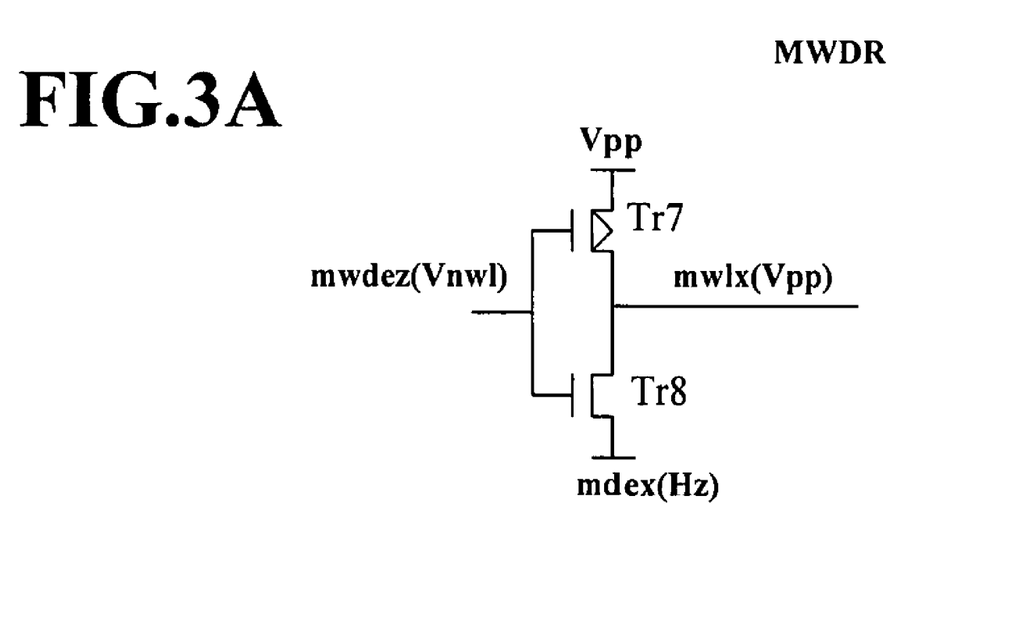
FIG. 3 is a view given in explanation of the main word driver circuit and the GIDL current thereof.

FIG. 3 is a view showing a main word drive circuit and its GIDL current. In the main word driver circuit shown in FIG. 3A, a drive PMOS transistor Tr7 and NMOS transistor Tr8 are connected; the main word decoding signal mwdez is connected to the third node, to which the gates of both these transistors are connected; boosted voltage Vpp is applied to the source (first node) of the PMOS transistor Tr7 while the main driver enabling signal mdex (floating Hz during standby) is supplied to the source (second node) of the NMOS transistor Tr8, and the main word line mwlx is connected to the connection node of these two transistors.

In the standby condition, the main word decoding signal mwdez is the negative voltage Vnwl: the drive PMOS transistor Tr7 is thereby put in conductive condition while the NMOS transistor Tr8 is put in non-conductive condition and the main word line mwlx assumes the boosted voltage Vpp. Also, since the source of the NMOS transistor Tr8 is put in floating condition, leakage current when this transistor is OFF is prevented. The source signal mdex of the transistor Tr8 could also be the boosted voltage Vpp.

Figure 3B:
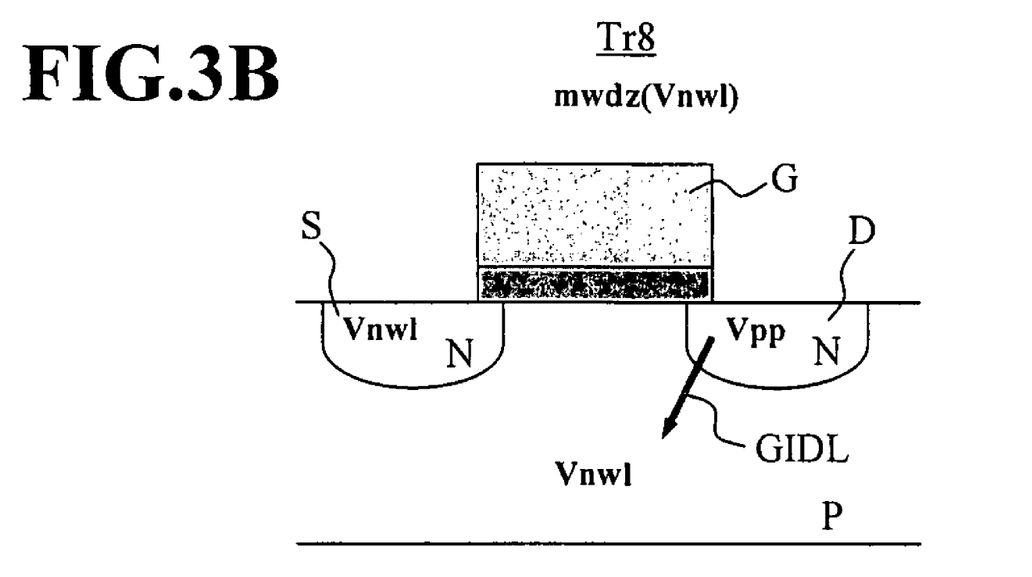

FIG. 3B shows a cross-sectional view of the NMOS transistor Tr8 of the main word driver circuit MWDR of FIG. 3A: the negative voltage Vnwl is applied to the P substrate, the source S is put in floating condition, and the boosted voltage Vpp is applied to the drain D. Also, the negative voltage Vnwl is applied to the gate G.

In this case, with lowering of the gate voltage, in the vicinity of the interface of the P-type substrate and the gate oxide film, leakage current in the direction from the drain to the substrate is generated. This is GIDL current. Consequently, in order to suppress the GIDL current due to this tunneling phenomenon, it is necessary to ensure that the voltage between the gate and drain and between the gate and source of the drive transistors in the standby condition does not become excessive.

Figure 4:
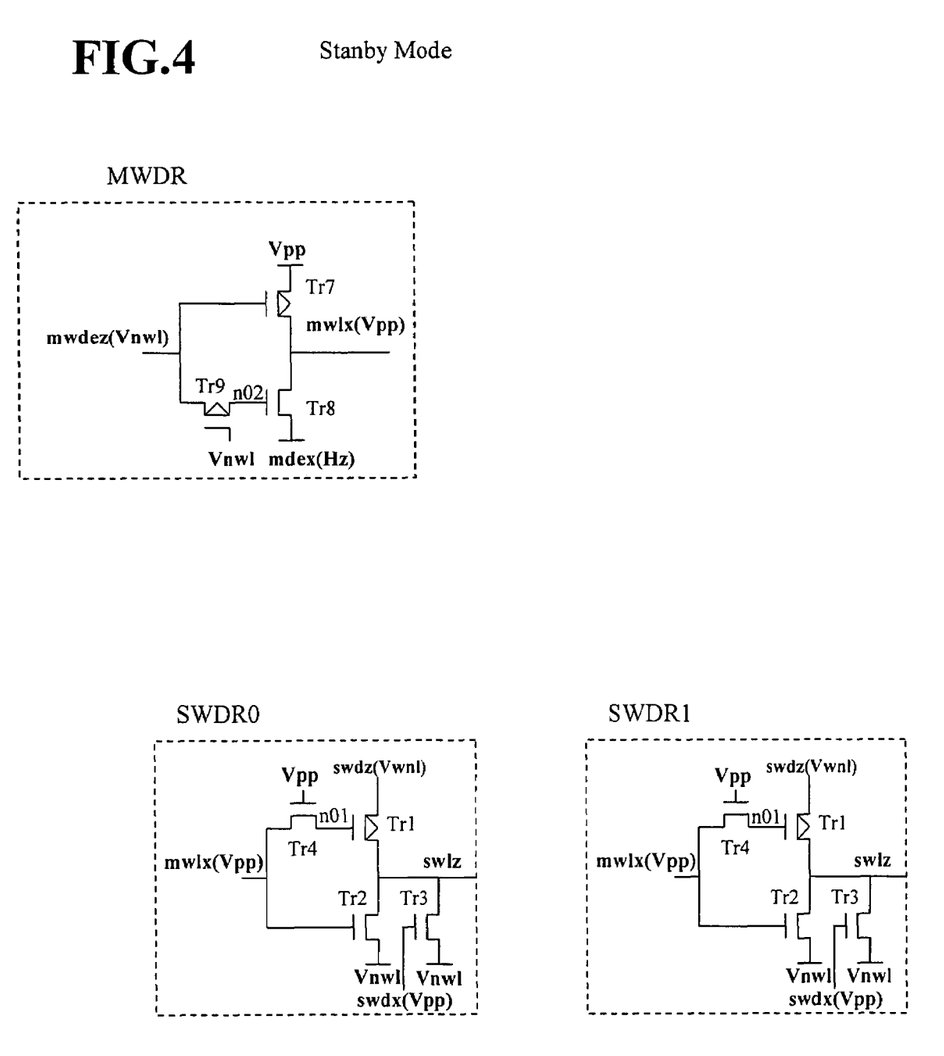
FIG. 4 is a view showing a word driver circuit in the present embodiment.

FIG. 4 is a view showing the word driver circuit in this embodiment. In FIG. 4, in combination with FIG. 1, a single main word driver MWDR and two sub-word drivers SWDR0,1 are shown. The two sub-word driver circuits SWDR are identical circuits.

Figure 5:
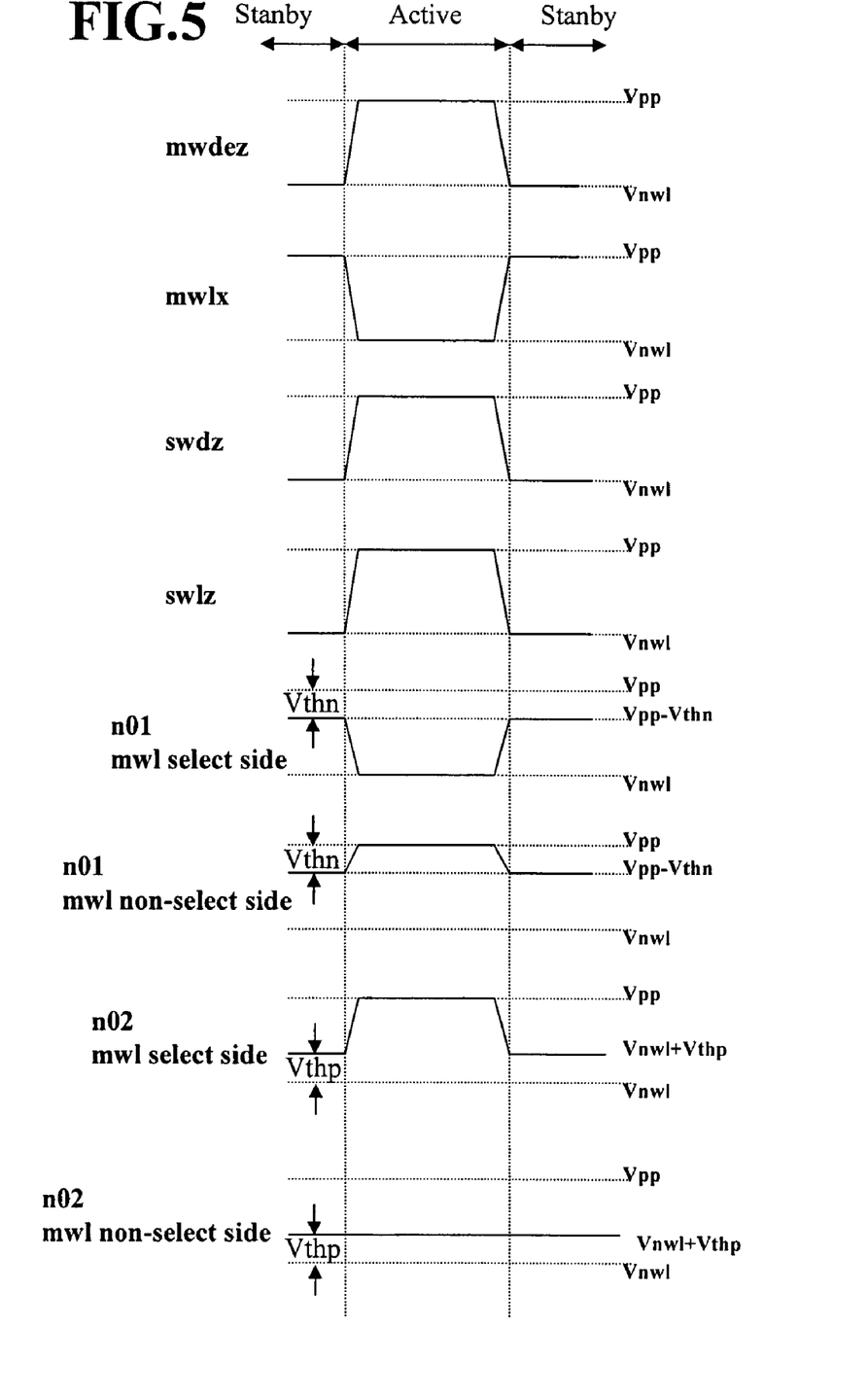
FIG. 5 is a view showing the voltage of the various modes of the word driver circuit in the present embodiment.

FIG. 5 is a view showing the voltage at the various modes of the word driver circuit in this embodiment. FIG. 5 shows the standby condition "Standby" and active condition "Active". The potentials of the various signals and nodes are between the negative voltage Vnwl and the boosted voltage Vpp. Also, in the active condition Active, the main word decoding signal mwdez, main word line mwlx, sub-word decoding signal swdz, and sub-word line swlz are respectively the potential of the selection condition, vpp, Vnwl, Vpp and Vpp. Consequently, in the non-selected condition, the respective potentials are the reverse potentials.

In FIG. 4, just as in the case of FIG. 2, the sub-word driver circuit SWDR comprises a drive PMOS transistor Tr1 and NMOS transistors Tr2, Tr3; the sub-word line mwlz is connected to the connection node of these. Also, the sub-word decoding signal swdz is connected to the source (first node) of the drive PMOS transistor Tr1 and the negative voltage Vnwl is applied to the source (second node) of the NMOS transistor Tr2. Also, the sub-word decoding signal swdx on the inverting side is connected to the gate of the drive NMOS transistor Tr3, and the negative voltage Vnwl is applied to the source. Up to this point is the same as in the case of FIG. 2.

The sub-word driver circuit SWDR of this embodiment comprises a leakage prevention NMOS transistor Tr4 between the gate of the drive PMOS transistor Tr1 and the main word line mwlx (third node). The boosted voltage Vpp or voltage in the vicinity thereof is applied to the gate of this leakage prevention transistor Tr4.

The voltages in the standby condition "Standby" of FIG. 5 are noted in FIG. 4. Specifically, the voltage of the main word line mwlx is the boosted voltage Vpp and the voltage of the sub-word decoding signal swdz of the source of the drive PMOS transistor Tr1 is the negative voltage Vnwl. However, by the provision of the leakage prevention transistor Tr4, the node n01 of the gate of the drive MPOS transistor Tr1 is only raised to a potential (Vpp−Vthn) that is lower than the gate voltage Vpp of the leakage prevention transistor Tr4 by the amount of the threshold voltage Vthn of this transistor. As a result, the voltage between the gate/source or drain of the P channel transistor Tr4 is suppressed, with the result that generation of leakage current is suppressed. That is, the voltages between the gate/drain and gate/source of the drive PMOS transistor Tr1, which constituted the cause of the GIDL current, are reduced by the amount of the threshold voltage of the leakage prevention transistor Tr4 and the leakage current, which is the cause of the GIDL current, is thus suppressed. In this case, the leakage current can be further reduced by adjusting the gate voltage of the leakage prevention transistor Tr4 to voltage in a vicinity lower than Vpp.

Next, in the same way as in the case of FIG. 3, in the main word driver MWDR, the drive PMOS transistor Tr7 and NMOS transistor Tr8 are connected between the boosted voltage Vpp and the main decoder enabling signal mdex (floating Hz during standby), and the main word line mwlx is connected to the connection node thereof. The main word decoding signal mwdez is supplied to the gates of these two transistors Tr7, Tr8.

The main word driver MWDR of this embodiment comprises a leakage prevention PMOS transistor Tr9 between the node of the main word decoding signal mwdez and the gate of the drive NMOS transistor Tr8. The negative voltage Vnwl or a voltage in the vicinity thereof is applied to the gate of this leakage prevention transistor Tr9.

In the standby condition, the main word decoding signal mwdez is a negative voltage Vnwl, but, by the provision of this leakage prevention transistor Tr9, the potential of the gate of the drive NMOS transistor Tr8 is lowered only as far as a potential (Vnwl+Vthp) that is higher than the negative voltage Vnwl of this gate by the amount of the threshold voltage Vthp of the transistor Tr9. At this point, the main word line mwlx, which is the drain of the drive NMOS transistor Tr8, is at the boosted voltage Vpp, but the potential of the gate node n02 of the transistor Tr8 is not much lowered, so the GIDL leakage current is suppressed.

Specifically, application of an excessively high voltage between the gate electrode and the drain is suppressed: the leakage current is thereby suppressed, making it possible to suppress the GIDL current.

Figure 6:
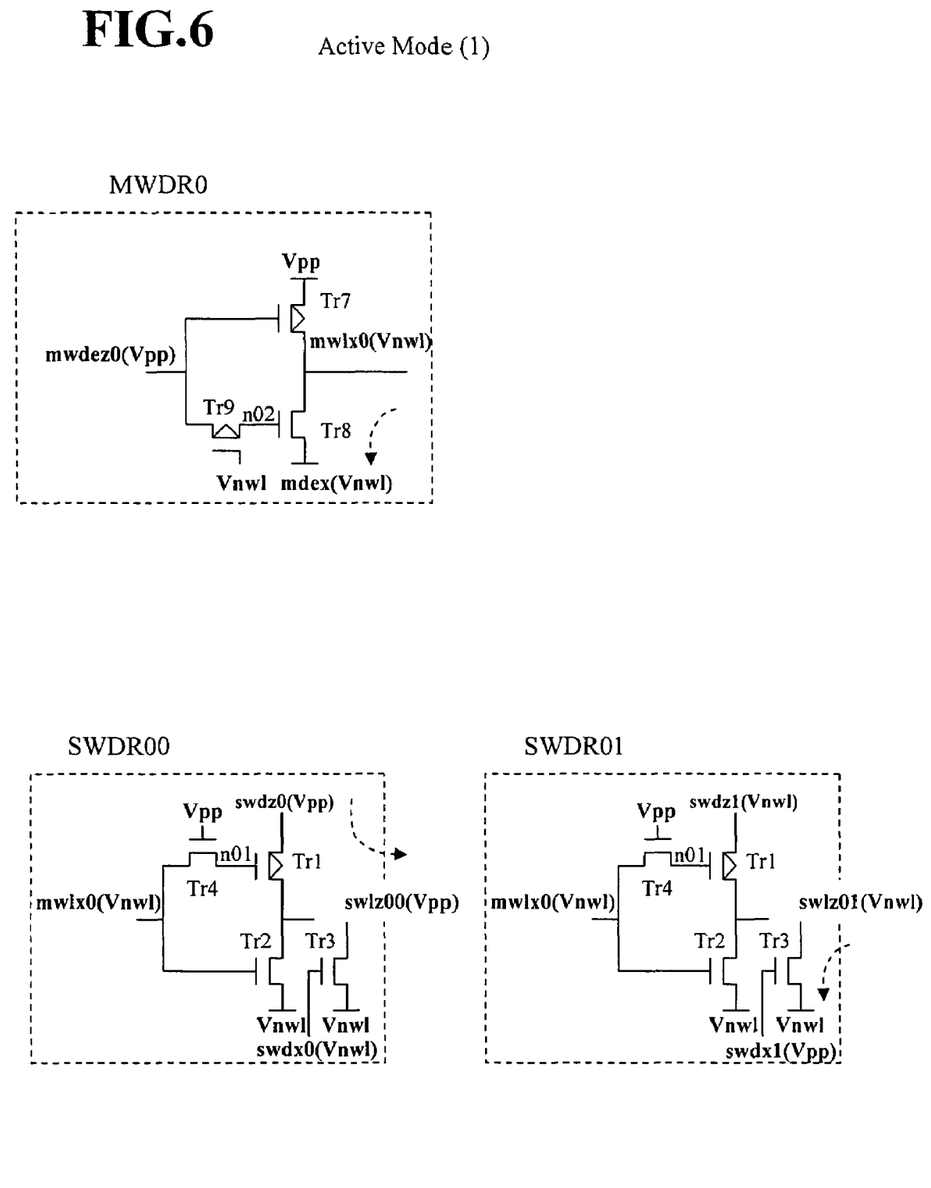
FIG. 6 is a view showing the voltage in the active condition of the main word driver and the sub-word driver in the present embodiment.
Figure 7:
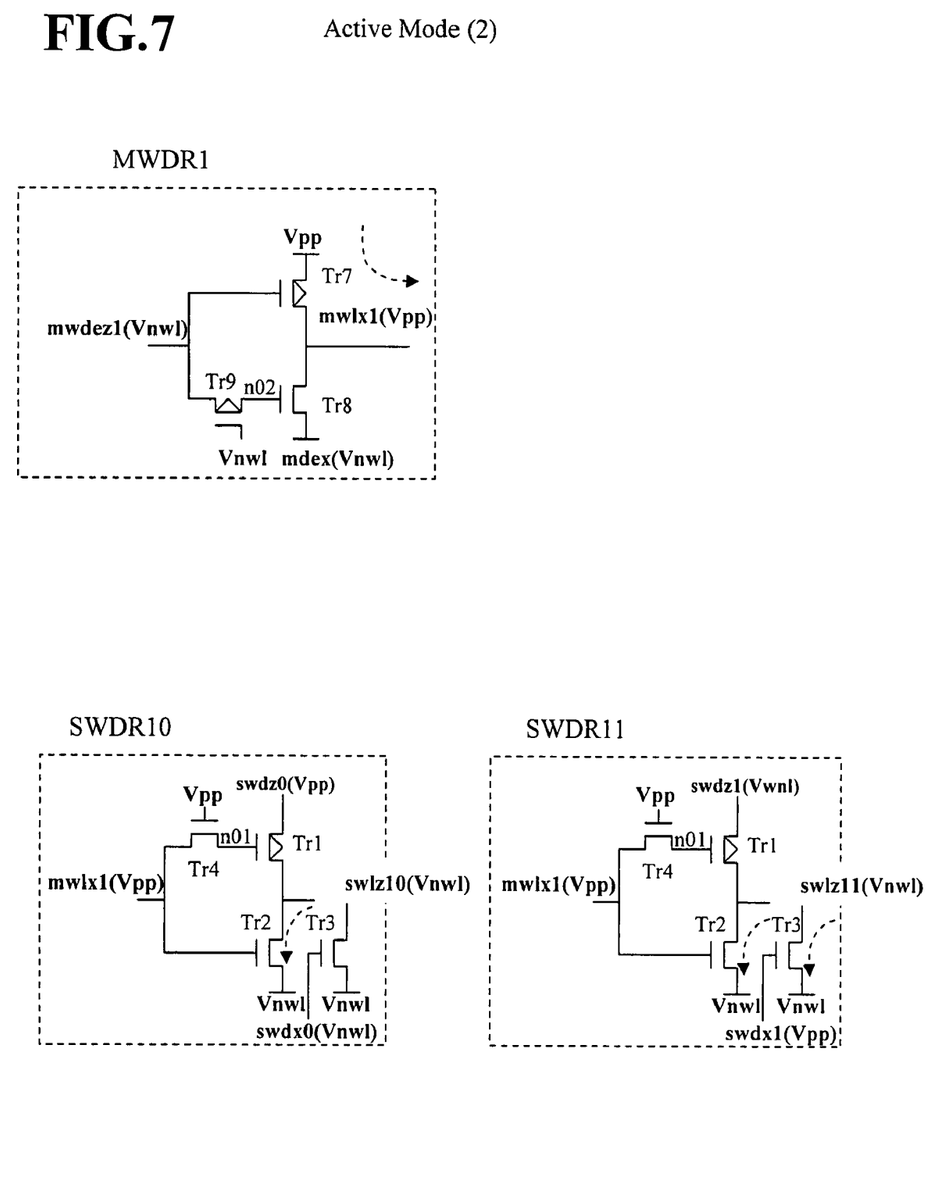
FIG. 7 is a view showing the voltage in the active condition of the main word driver and the sub-word driver in the present embodiment.

FIG. 6 and FIG. 7 are views showing the voltage in the active condition of the main word line driver and the sub-word line drivers in this embodiment. FIG. 6 shows the circuit associated with the main word line mwl0 and FIG. 7 shows the circuit associated with the main word line mwl1. Also, in the active condition, it will be assumed that the sub-word line swl00 is selected.

In FIG. 6, in the case of the main word driver MWDR0, when the main word decoding signal mwdez0 becomes the boosted voltage Vpp, the drive NMOS transistor Tr8 conducts, and the main word line mwlx0 is driven with the negative voltage Vnwl of the main driver enabling signal mdex that is applied to the source of the transistor Tr8. Although a leakage prevention PMOS transistor Tr9 is provided between the main word decoding signal mwdex0 and gate of the transistor Tr8, since this gate is of negative voltage Vnwl, the transistor Tr9 goes fully into the conductive condition, with the result that the node n02 rises to the boosted voltage Vpp, and the drive NMOS transistor Tr8 goes fully into the conductive condition and the main word line mwlx0 is driven to the negative voltage Vnwl.

Next, in the case of the sub-word driver SWDR00, the sub-word decoding signal swdz0 becomes boosted voltage Vpp and the inverted signal swdx0 thereof becomes negative voltage Vnwl; the negative voltage Vnwl of the main word line mwlx0 causes the drive PMOS transistor Tr1 to conduct, with the result that the sub-word line swlz00 is driven with the selection level boosted voltage Vpp. In contrast, in the case of the other sub-word driver SWDR01, the sub-word decoding signal swdz1 becomes negative voltage Vnwl and the inverted signal swdx0 thereof becomes boosted voltage Vpp and the drive NMOS transistor Tr3 conducts, with the result that the sub-word line swlz01 is driven with the non-selection level negative voltage Vnwl.

In FIG. 7, in the case of the main word driver MWDR1, the main word decoding signal mwdez1 becomes negative voltage Vnwl, the drive PMOS transistor Tr7 conducts, and the main word line mwlx1 is driven with the boosted voltage Vpp (non-selection level) of the source of the transistor Tr7.

Next, in the case of the sub-word driver SWDR10, the sub-word decoding signal swdz0 becomes boosted voltage Vpp and the inverted signal swdx0 thereof becomes negative voltage Vnwl, the driver and NMOS transistor Tr2 conducts, and the sub-word line swlz10 is driven to the non-selection level negative voltage Vnwl. Since the main word line mwlx1 is then boosted voltage Vpp, the leakage prevention NMOS transistor Tr4, whose gate is at boosted voltage Vpp, assumes the OFF condition. Consequently, accompanying the rise of the sub-word decoding signal swdz0 to the boosted voltage Vpp, due to the coupling capacity between the gate and source of the drive PMOS transistor Tr1, the node n01 is raised from Vpp−Vthn to Vpp, causing the drive PMOS transistor Tr1 to assume a fully non-conducting condition. On the other hand, the conduction of the drive NMOS transistor Tr2 causes the sub-word line swl10 to be driven with negative voltage Vnwl.

It is therefore desirable to arrange the layout in such a way that coupling capacity is positively formed between the gate and source of the drive PMOS transistor Tr1. For example a layout is desirable such that the gate electrode is made to extend over the source region, with insulating film provided therebetween.

In the case of the other sub-word driver SWDR11, the sub-word decoding signal swdz1 becomes negative voltage Vnwl and the inverted signal swdx0 thereof becomes boosted voltage Vpp, and the drive NMOS transistors Tr2, Tr3 conduct, causing the sub-word line swlz11 to be driven with the non-selection level negative voltage Vnwl.

Figure 8:
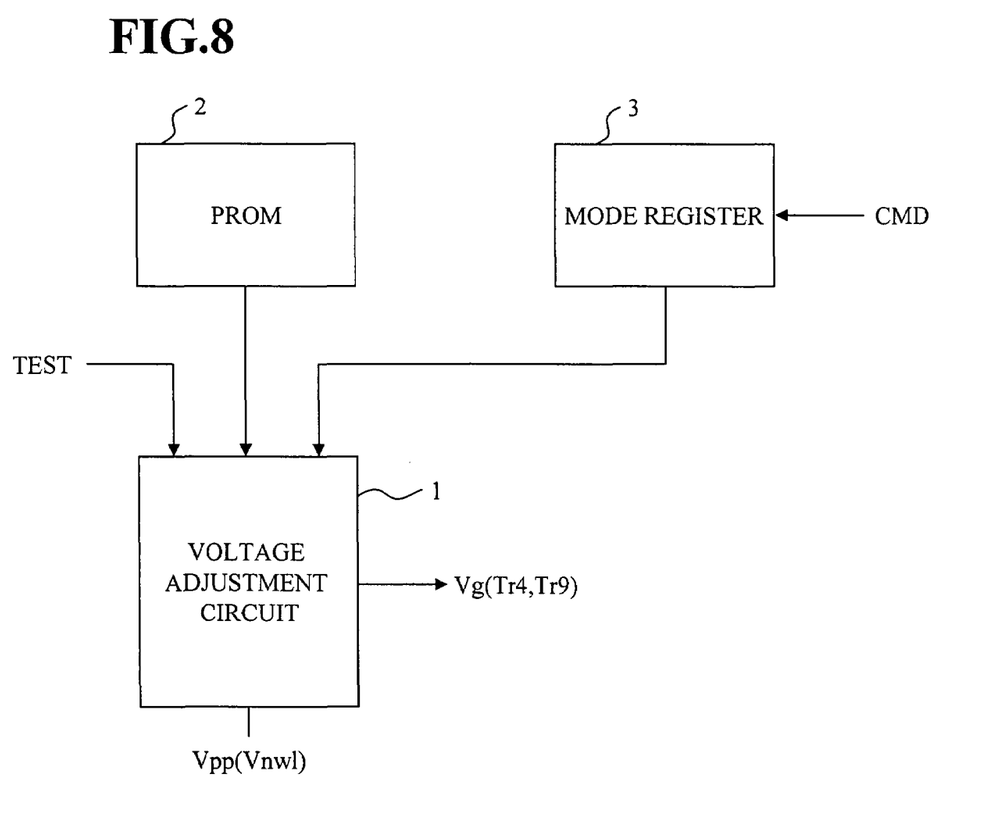
FIG. 8 is a view showing a circuit for adjusting the gate voltage of a leakage prevention transistor in the present embodiment.

FIG. 8 is a view showing the circuit whereby the gate voltage of the leakage prevention transistor is adjusted in this embodiment. Preferably the gate voltage of the leakage prevention transistor Tr9 of the main word driver MWDR and the gate voltage of the leakage prevention transistor Tr4 of the sub-word driver SWDR are adjustable to a voltage level such as to achieve fully satisfactory reduction of the GIDL current. Specifically, in the case of the main word driver MWDR, the gate voltage of the leakage prevention transistor Tr9 is Vnwl and the node n02 is Vnwl+Vthp, so the gate/drain voltage of the drive transistor Tr8 can be made lower by making the gate voltage Vnwl of the leakage prevention transistor Tr9 higher. Likewise, in the case of the sub-word driver SWDR, the gate voltage of the leakage prevention transistor Tr4 is Vpp and the node n01 is Vpp-Vthn, so the voltage between the gate and drain and the voltage between the gate and source of the drive transistor Tr1 can be made lower by making the gate voltage Vpp of the leakage prevention transistor Tr4 lower.

It is therefore desirable to provide a circuit for gate voltage adjustment as shown in FIG. 8. The voltage adjustment circuit 1 may be a circuit that supplies a voltage Vg obtained by adjusting the boosted voltage Vpp to the gate of the leakage prevention transistor Tr4 or may be a circuit that supplies a voltage Vg obtained by adjusting the negative voltage Vnwl to the gate of the leakage prevention transistor Tr9.

The voltage adjustment of this voltage adjustment circuit 1 may be performed by means of a test signal TEST on testing. Specifically, after adjustment of the voltage of the output Vg of the voltage adjustment circuit 1 using the test signal TEST, the information as to the optimum voltage adjustment level detected by the test is stored in a PROM 2. Then, during normal operation, the optimally adjusted voltage Vg is output by the voltage adjustment circuit 1 in accordance with the voltage adjustment level information signal from the PROM 2. Alternatively, the voltage Vg optimally adjusted by the voltage adjustment circuit 1 may be arranged to be output in response to a signal from a mode register 3 that is set in response to a command CMD.

Thus the gate voltage of the leakage prevention transistors Tr4, Tr9 need not necessarily be the same voltage as Vpp or Vnwl, but could be a voltage adjusted in the vicinity of these. For example, the gate voltage of the leakage prevention transistor Tr4 must be of a level that is fully adequate for conduction of the leakage prevention transistor Tr4 in the condition of the sub-word driver SWDR00 of FIG. 6, and must be a level at which the transistor Tr1 is in the non-conductive condition in the condition of the sub-word driver SWDR01 of FIG. 6 and of the sub-word drivers SWDR10, 11 of FIG. 7. Also, the gate voltage of the leakage prevention transistor Tr9 must be a level that is fully adequate for conduction of the leakage prevention transistor Tr9 in the condition of the main word driver MWDR0 of FIG. 6 and must be a level at which the transistor Tr8 is in the non-conductive condition in the condition of the main word driver MWDR of FIG. 7.

As described above, for a DRAM mounted on for example a mobile telephone, the period of the standby condition is extremely long compared with the period of the active condition. Consequently, the standby time can be prolonged by suppressing battery consumption of the mobile telephone by suppressing the leakage current in the standby condition.

Figure 9A:
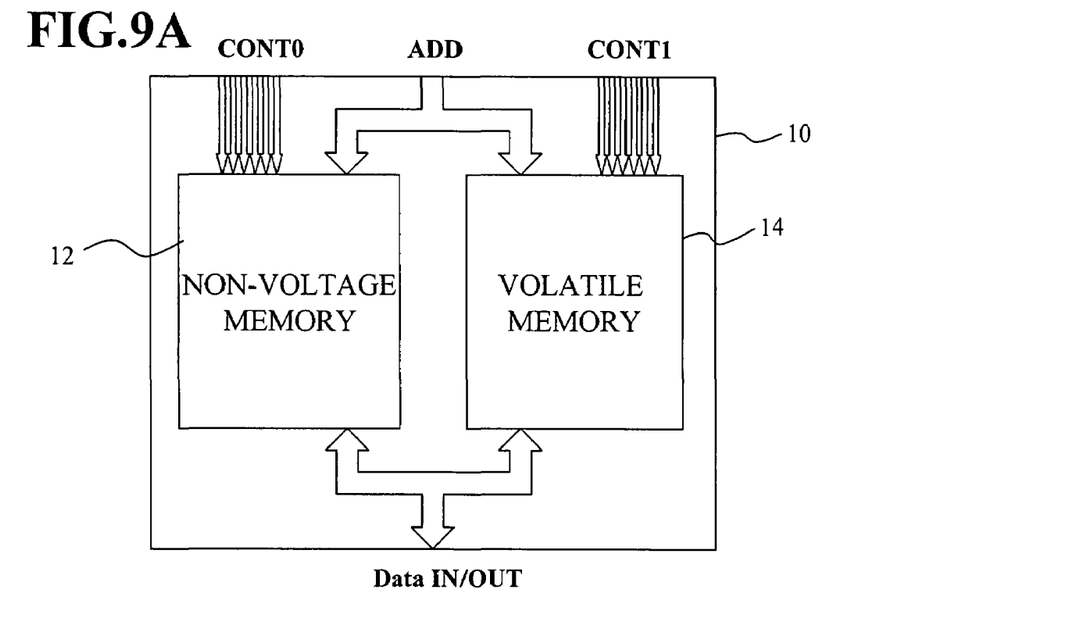
FIG. 9 is a view showing an example of application to a DRAM in the present embodiment.

FIG. 9 is a view showing an example of application of a DRAM in this embodiment. FIG. 9A shows a semiconductor device 10 wherein non-volatile memory 12 such as flash memory or FeRAM and a DRAM14 according to this embodiment are accommodated in a common package. Usually a mobile telephone or the like carries both non-volatile memory and DRAM, so this semiconductor device 10 that accommodates these two chips is effective in reducing the size of the mobile telephone.

Figure 9B:
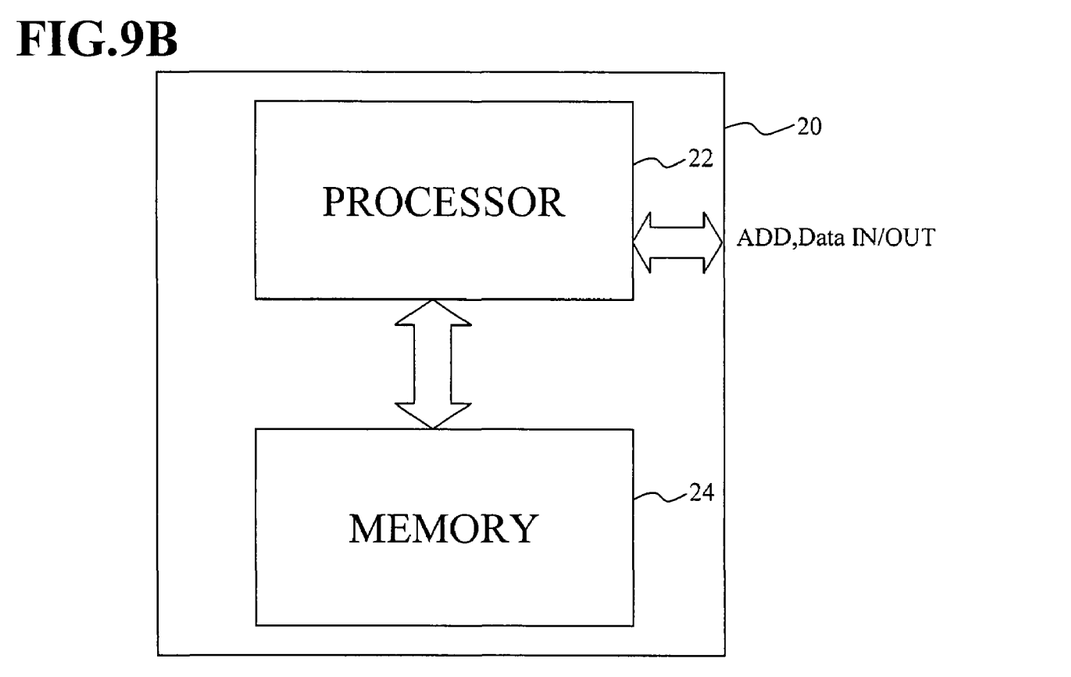

FIG. 9B is an ASIC 20 comprising a processor 22 and a DRAM 24 as external memory connected therewith. The processor 22, which is developed for prescribed control purposes, requires DRAM or simulated SRAM as external memory, so such an ASIC 20 is effective for this purpose.

As described above, with a semiconductor device according to this embodiment, the leakage current in the standby condition can be suppressed.

What is claimed is:

1. A semiconductor memory having a plurality of word lines and bit lines and memory cells arranged at the positions of intersection thereof, the semiconductor memory comprising:
    a word driver circuit that drives the word line and has a drive PMOS transistor and drive NMOS transistor which are connected in series between a first node and a second node and each of which has a gate connected to a third node, said word line being connected to a connection node of the two transistors;
    a first voltage generating circuit that generates a first voltage; and
    a second voltage generating circuit that generates a second voltage lower than said first voltage, wherein
    said first voltage or said second voltage is applied to said third node, and said first voltage or second voltage is applied to said first node; and
    between said third node and the gate of the drive PMOS transistor, there is provided a leakage prevention NMOS transistor having a gate applied with a prescribed voltage.

2. The semiconductor memory according to claim 1, wherein said word line comprises a segmented structure having a main word line and a plurality of sub-word lines belonging to the main word line, and
    in said word driver circuit, said main word line is connected to said third node, a sub-word decoding signal that selects a single sub-word line from said plurality of sub-word lines is supplied to said first node, and said word driver circuit drives said sub-word line with said first voltage or second voltage in accordance with the potential of said main word line and the potential of the sub-word decoding signal.

3. The semiconductor memory according to claim 1, wherein the prescribed voltage of the gate of said leakage prevention NMOS transistor is said first voltage or a voltage in the vicinity thereof.

4. The semiconductor memory according to claim 1, wherein in a standby condition, said third node assumes said first voltage, said first node assumes said second voltage, said word line assumes said second voltage, and the gate of said drive PMOS transistor assumes a potential that is lower than the voltage of the gate of the leakage prevention NMOS transistor by the amount of a threshold voltage of the transistor.

5. The semiconductor memory according to claim 1 further comprising a voltage adjustment circuit that generates an output voltage that is adjusted in accordance with a prescribed control signal, wherein the output voltage of the voltage adjustment circuit is applied to the gate of said leakage prevention NMOS transistor as said prescribed voltage.

6. The semiconductor memory according to claim 1, wherein a coupling capacitance is formed between the source and gate of said drive PMOS transistor.

7. The semiconductor memory according to claim 2, wherein said word driver circuit further comprises a second drive NMOS transistor that is provided in parallel with said drive NMOS transistor, and
    a reverse phase sub-word decoding signal that is of reverse phase to the sub-word decoding signal supplied to said first node is supplied to the gate of the second drive NMOS transistor.

8. A semiconductor memory having a plurality of word lines and bit lines and memory cells arranged at the positions of intersection thereof, the semiconductor memory comprising:
    a word driver circuit that drives the word line and has a drive PMOS transistor and drive NMOS transistor which are connected in series between a first node and a second node and each of which has a gate connected to a third node, said word line being connected to a connection node of the two transistors;
    a first voltage generating circuit that generates a first voltage; and
    a second voltage generating circuit that generates a second voltage lower than said first voltage, wherein
    said first voltage or second voltage is applied to said third node, and said first voltage is applied to said first node, and
    between said third node and the gate of the drive NMOS transistor, there is provided a leakage prevention PMOS transistor having a gate applied with a prescribed voltage.

9. The semiconductor memory according to claim 8, wherein said word line comprises a segmented structure having a main word line and a plurality of sub-word lines belonging to the main word line, and
    in said word driver circuit, said main word line is connected to the connection node of said drive transistors, and a decoding signal that selects the main word line is supplied to said third node.

10. The semiconductor memory according to claim 8, wherein the prescribed voltage of the gate of said leakage prevention PMOS transistor is said second voltage or a voltage in the vicinity thereof.

11. The semiconductor memory according to claim 8, wherein in a standby condition, said third node assumes said second voltage, said first node assumes said first voltage, said word line assumes said first voltage, and the gate of said drive NMOS transistor assumes a potential that is higher than the voltage of the gate of the leakage prevention PMOS transistor by the amount of a threshold voltage of the transistor.

12. The semiconductor memory according to claim 8 further comprising a voltage adjustment circuit that generates an output voltage that is adjusted in accordance with a prescribed control signal, wherein the output voltage of the voltage adjustment circuit is applied to the gate of said leakage prevention PMOS transistor as said prescribed voltage.

13. A semiconductor memory having a plurality of word lines and bit lines and memory cells arranged at the positions of intersection thereof,
    wherein said word line comprises a segmented structure having a plurality of main word lines and a plurality of sub-word lines respectively belonging to these main word lines,
    the semiconductor memory further comprises:

a first voltage generating circuit that generates a first voltage;

a second voltage generating circuit that generates a second voltage lower than said first voltage;

a main word driver circuit that drives the main word line and has a first drive PMOS transistor and first drive NMOS transistor which are connected in series between a first node and a second node and each of which has a gate connected to a third node, said main word line being connected to a connection node of the two transistors;

a sub-word driver circuit that drives the sub-word line and has a second drive PMOS transistor and second drive NMOS transistor which are connected in series between a fourth node and a fifth node and each of which has a gate connected to a sixth node, said sub-word line being connected to a connection node of the two transistors, in said main word driver circuit, said first voltage or second voltage is applied to said third node, and said first voltage is applied to said first node, and between said third node and the gate of the first drive NMOS transistor, there is provided a leakage prevention PMOS transistor having a gate applied with a prescribed voltage, and in said sub-word driver circuit, said main word line is connected to said sixth node and said first-voltage or said second voltage is applied thereto, a sub-word decoding signal having said first voltage or second voltage is applied to said fourth node, and, between said sixth node and the gate of the second drive PMOS transistor, there is provided a leakage prevention NMOS transistor having a gate applied with a prescribed voltage.

14. The semiconductor memory according to claim 13, wherein the prescribed voltage of the gate of said leakage prevention PMOS transistor is said second voltage or a voltage in the vicinity thereof, and the prescribed voltage of the gate of said leakage prevention NMOS transistor is said first voltage or a voltage in the vicinity thereof.

* * * * *